(12) United States Patent
Kamei et al.

(10) Patent No.: US 8,900,419 B2
(45) Date of Patent: Dec. 2, 2014

(54) METHOD OF SWITCHING MAGNETIC FLUX DISTRIBUTION

(71) Applicants: Masayuki Kamei, Tsukuba (JP); Takamasa Ishigaki, Tsukuba (JP)

(72) Inventors: Masayuki Kamei, Tsukuba (JP); Takamasa Ishigaki, Tsukuba (JP)

(73) Assignee: National Institute for Materials Science, Tsukuba-Shi (JP)

( * ) Notice: Subject to any disclaimer, the term of this patent is extended or adjusted under 35 U.S.C. 154(b) by 11 days.

(21) Appl. No.: 13/790,412

(22) Filed: Mar. 8, 2013

(65) Prior Publication Data
US 2013/0186744 A1 Jul. 25, 2013

Related U.S. Application Data

(63) Continuation of application No. 11/631,957, filed as application No. PCT/JP2005/012968 on Jul. 7, 2005, now abandoned.

(30) Foreign Application Priority Data

Jul. 9, 2004 (JP) ................ 2004-203156
Aug. 9, 2004 (JP) ................ 2004-232709

(51) Int. Cl.
*C23C 14/35* (2006.01)
*C23C 14/08* (2006.01)
*H01J 37/34* (2006.01)
*B01J 37/34* (2006.01)
*B01J 35/00* (2006.01)
*B01J 21/06* (2006.01)

(52) U.S. Cl.
CPC ............ *C23C 14/351* (2013.01); *C23C 14/352* (2013.01); *C23C 14/083* (2013.01); *H01J 37/3435* (2013.01); *B01J 2219/00745* (2013.01); *B01J 2219/00754* (2013.01); *B01J 2219/00443* (2013.01); *C23C 14/35* (2013.01); *B01J 37/346* (2013.01); *B01J 21/063* (2013.01); *B01J 21/06* (2013.01); *B01J 35/004* (2013.01); *H01J 37/3405* (2013.01); *H01J 37/3461* (2013.01); *B01J 2219/00527* (2013.01)
USPC .............. 204/192.12; 204/192.1; 204/298.16; 204/298.19

(58) Field of Classification Search
USPC ................. 204/192.12, 192.1, 298.16, 298.19
See application file for complete search history.

(56) References Cited

U.S. PATENT DOCUMENTS

| 4,282,083 | A | * | 8/1981 | Kertesz et al. | 204/298.17 |
| 4,842,703 | A | * | 6/1989 | Class et al. | 204/192.12 |
| 5,736,019 | A | * | 4/1998 | Bernick | 204/298.07 |
| 6,416,639 | B1 | * | 7/2002 | De Bosscher et al. | 204/298.2 |

* cited by examiner

*Primary Examiner* — Jason M Berman
(74) *Attorney, Agent, or Firm* — Manabu Kanesaka

(57) ABSTRACT

In a method of switching magnet flux distribution, a magnet is arranged on a rear side of a backing plate with respect to a target holding side thereof in a magnetron sputtering cathode, and placing an article that exhibits ferromagnetism at room temperature on the target holding side of the backing plate or removing the article therefrom so that the magnet flux distribution is switched between a balanced distribution of the magnetic flux and unbalanced distribution of the magnetic flux.

3 Claims, 7 Drawing Sheets

METHOD OF SWITCHING MAGNETIC FLUX DISTRIBUTION

CROSS REFERENCE TO RELATED APPLICATION

This is a continuation application of Ser. No. 11/631,957 filed on Jan. 9, 2007, which is a PCT National Phase of PCT/JP2005/012968 filed on Jul. 7, 2005, which claims priorities of Japanese Patent Application No. 2004-203156 filed on Jul. 9, 2004 and No. 2004-232709 filed on Aug. 9, 2004.

TECHNICAL FIELD

In one aspect, the present invention relates to a magnetron sputtering device in which configuration of the magnetron cathode can be readily altered by switching to convert a balanced distribution of magnetic fluxes into an unbalanced distribution of magnetic fluxes, and to a film formation method for forming a film from an inorganic film formation material using the device which has been set to produce an unbalanced distribution of magnetic fluxes (this aspect of the invention will be called "the first aspect of the invention" hereinafter).

In another aspect, the present invention relates to a dual mode magnetron sputtering device enabling the high speed formation of a film at a low temperature, and to a sputtering method enabling the formation of a film at a low temperature using the aforementioned device (this aspect of the invention will be called "the second aspect of the invention" hereinafter).

BACKGROUND ART

With regard to a sputtering-based film formation device incorporating a magnetron, it has been known that configuration of the cathode of a magnetron can be classified to the balanced type and unbalanced one in terms of the distribution of magnetic fluxes.

According to the balanced type magnetic flux designing, a magnetic field is produced so as to restrict plasma strictly locally to the surface of a target which is placed on the surface of a cathode. To achieve this mode of magnetic field setting, a magnetron includes a plurality of permanent magnets, and adjusts the intensities of individual magnets such that magnetic fluxes emanating from N poles of the magnets pass through a space adjacent to the target and converge almost totally to S poles of the magnets, namely, a closed magnetic flux circuit is formed through the space. According to this mode of operation, it is possible to restrict plasma strictly close to the surface of the target.

In contrast with this, according to the unbalanced type magnetic flux designing, a magnetron includes a plurality of permanent magnets, and adjust the intensities of individual magnets such that one part of magnetic fluxes forms a closed circuit as does a magnetron prepared according to the balanced type magnetic flux designing, while the other part is radiated in a three-dimensional space to be dispersed diffusely (see URL: http://www.kobelco.co.jp/p109/pvd/ubm-s.htm).

These two types of magnetic flux designing have their own advantages and disadvantages in terms of film formation. According to the balanced type designing, it is possible to restrict plasma necessary for film formation strictly close to the surface of cathode which allows the high speed formation of a film.

In contrast, the cathode of a magnetron sputtering device arranged to produce a magnetic field evoking an unbalanced distribution of magnetic fluxes allows plasma not only to be distributed close to the surface of cathode but also to be dispersed diffusely towards the surface of a substrate which is placed opposite to the cathode and upon which a film is to be formed, which allows the more vigorous spread of ions and radicals or reactive elementary particles in plasma onto the surface of the substrate than is possible with a corresponding cathode arranged according to the balanced type designing, thereby achieving the more enhanced elicitation of reactions and growth of crystals upon the surface of the substrate, although the cathode in question does not allow the formation of a film to proceed as fast as the comparable cathode based on the balanced type designing.

Thanks to the above merits, so it has been thought, the cathode of a magnetron sputtering device arranged to produce an unbalanced magnetic field can be applied to a substrate constituted of a heat-labile material which will reject a film formation process necessarily accompanied by high temperature, and will allow a well-crystallized film to be formed at a lower temperature than is possible with a comparable cathode prepared according to the balanced type magnetic flux designing.

When a film is to be formed on a substrate, the most appropriate mode of magnetic flux arrangement should be chosen according to a given purpose of the film formation. To meet such a requirement, it is ideal to prepare two devices one operating exclusively according to the balanced type magnetic flux designing and the other to the unbalanced counterpart, and to choose either one according to a given requirement of film formation. However, the sputtering device is so expensive that the problem under study is generally solved by removing the cathode of a single existing device and adjusting parameters of the cathode so that it allows the generation of magnetic fluxes whose distribution is most appropriate for a given purpose of film formation, that is, the magnetic flux distribution is changed from one mode to the other or vice versa according to a given purpose of film formation.

This switching operation will be described below with reference to attached drawings taking, as an example, a case where the cathode of a magnetron sputtering device which has been set to the balanced mode is altered to give a magnetic field to evoke an unbalanced distribution of magnetic fluxes. Needless to say, the reverse case may happen as often.

Referring to FIG. 1, magnetic fluxes (not shown) for restricting plasma (not shown) to the surface of a material target (4) are generated by a magnet assembly (7) comprising a plurality of permanent magnets (6) placed behind a backing plate (5) which holds the material target (4). The magnetic fluxes pass through the backing plate (5) and material target (4) to form a magnetic field close to the surface of material target. The balanced magnetic field arrangement (FIG. 1) can be achieved by mounting, to the device, a magnet assembly where the intensities of individual magnets have been adjusted to allow magnetic fluxes emanating from N poles of the magnets to converge nearly totally onto S poles of the magnets, namely, a closed magnetic flux circuit to be formed between the two poles.

Let's assume that the above device should be altered to provide an unbalanced distribution of magnetic fluxes. First, the magnet assembly (7) comprising magnets (6) as shown in FIG. 1 which has been set to produce a balanced distribution of magnetic fluxes is removed, and it is exchanged for another magnet assembly (11) as shown in FIG. 2 where the intensities of individual magnets of the assembly have been adjusted so as to cause a part of magnetic fluxes emanating from N poles of the magnets not to return to S poles of the magnets but to be dispersed diffusely in a three-dimensional space (see URL: http://www.kobelco.co.jp/p109/pvd/ubms.htm).

Alternately, switching the distribution of magnetic fluxes from the balanced mode to the unbalanced one may occur as follows. A magnet assembly which has been set to give a balanced distribution of magnetic fluxes is removed and disassembled. Into the magnet assembly thus disassembled, a magnetic modifier (8) such as a ferromagnetic body may be inserted as shown in FIG. 3 so as to modify the convergence state of magnetic fluxes to convert thereby the balanced mode of magnetic flux distribution into the unbalanced one.

However, the actual process necessary for the conversion is not so simple. Let's assume that a device set to give a balanced distribution of magnetic fluxes as shown in FIG. 1 should be altered to give an unbalanced distribution as shown in FIGS. 2 and 3. Cooling water in contact with the backing plate (5) is purged; cooling water pipes (9) and a power cable (10) are removed; a balanced type magnet assembly (7) (bulky and heavy) is removed, and an unbalanced type magnet assembly (11) is mounted instead, or the balanced type assembly is modified by adding a modifier such as a ferromagnetic body thereto so as to establish an unbalanced distribution of magnetic fluxes. In the latter case, during the installment of the modified magnet assembly, the cooling water pipes (9) and power cable (10) must be reconnected. All these procedures are so complicated and require such a hard labor that completion of them will take several hours.

Above all, adjustment of the magnet assembly to give a desired configuration of magnetic field requires experience and technique so rich and high that even a technician skilled in the work does not feel ease at the work. In addition, when modification of a magnet assembly consists of inserting a modifier constituted of a ferromagnetic substance into a gap at one end of a magnet, insertion of the modifier itself is often difficult actually because there is not enough room at the ends of a magnet. Thus, modification of a magnet assembly by inserting a modifier at one end of an appropriate magnet is often infeasible.

In magnetron sputtering, the quality of a film formed thereby is very important because it seriously affects all the subsequent processes leading to the production of a final product. In this respect, choice of the type of magnetic field design, and adjustment of a magnet assembly in accordance with the design are very important. Thus, it is necessary to separately use two kinds of cathodes operating on two different modes, one to give a magnetic field capable of evoking a balanced distribution of magnetic fluxes and the other a magnetic field capable of evoking an unbalanced distribution of magnetic fluxes, depending on the material of a film to be formed and purpose of the product.

Specifically, when the process for film formation may tolerate a comparatively high temperature, but must proceed at a high speed, a cathode configured to give a balanced mode magnetic field should be adopted. On the contrary, when the process for film formation does not tolerate a high temperature, a cathode configured to give an unbalanced mode magnetic field should be used at a low temperature, even though the speed with which film is formed will be reduced, because then it will be possible to produce a film possessed of high quality crystals.

Requirement for switching from the balanced mode operation to the unbalanced one or vice versa occurs at a considerably high frequency in research and production sites, and thus the switching operation requiring several hours as mentioned above has been a heavy burden for those involved in the operation.

Even if it is decided, for example, to select a cathode arrangement that gives an unbalanced magnetic field, it is still necessary to further adjust the radiation of magnetic fluxes into a three-dimensional space (by altering the intensities of individual magnets, their distribution, and size and shape of a ferromagnetic body) depending on the material of a film to be formed so as to give an optimum result for that particular material. In such an optimization work, it is often necessary to switch between the balanced mode operation and unbalanced one many times for a single operation, which will further contribute to the prolongation of time necessary for switching, and thereby add to the heavy burden.

Furthermore, adjusting the radiation of magnetic fluxes into a three-dimensional space (by altering the intensities of individual magnets, their distribution, and size and shape of a ferromagnetic body) requires highly advanced technical knowledge and experience, and is not easily achievable.

Still further, if it is required to convert configuration of the cathode from the balanced mode to the unbalanced one and the conversion is performed by inserting a ferromagnetic body into a gap between a backing plate (5) and an appropriate magnet (6), a case is often encountered where there is no enough room between the backing plate (5) and the magnet (6), because usually the cathode has been designed to allow magnetic fluxes to efficiently converge onto the surface of a material target. Because of this, even if it is required to alter the configuration of an existing magnetron sputtering device so as to give a magnetic field matching the property of a given material, adjustment of the radiation of magnetic fluxes into a three-dimensional space is often limited within a certain range. Thus, it is often impossible to modify the configuration of cathode to such a degree as to evoke a magnetic field that provides a desired unbalanced distribution of magnetic fluxes. Particularly even if it is required to produce an unbalanced magnetic field to enable low temperature sputtering, the requirement may not be satisfied in some cases. Thus, demand is acute for a remedy to drastically solve the problem.

It has been known, to smoothly achieve low temperature sputtering, it is more advantageous to employ a so-called dual magnetron sputtering device incorporating two units of magnetrons which allows the rapid formation of a film at a low temperature, as compared with an ordinary magnetron sputtering device based on a single unit of magnetron which will require full scale operation within its capacity to achieve the same purpose. In the dual magnetron sputtering device, the same problem as described above in relation to an ordinary magnetron sputtering device is also observed: selection of the balanced type magnetic flux design or unbalanced one should be made according to the property of material, and switching from one type to the other requires much labor and skill, and imposes a heavy burden to those involved in the operation. The problem also remains to be solved.

Recently, demand is manifest for film forming sputtering which allows the formation of a film made of an inorganic material having a high melting point over a substrate constituted of an organic polymer sheet having a low melting point. To meet the demand, particularly to provide sputtering allowing the formation of such a film at a low temperature, it is necessary to provide a device designed to give an unbalanced distribution of magnetic fluxes, as well as a film formation method enabling the formation of a film at a low temperature. It is often difficult to meet the demand even for a dual magnetron sputtering device which has been designed to produce an unbalanced distribution of magnetic fluxes. Thus, it is often difficult even for a dual magnetron sputtering device to meet all the requirements imposed by the recently developed widely varied materials and their combinations. Solutions to these problems are strongly wanted.

The background art relating to the first aspect of the invention has been described above. Next, the prior art relating to the second aspect of the invention, that is, a dual magnetron sputtering device will be described.

First, a conventional dual magnetron sputtering device will be described with reference to FIG. 9.

Referring to FIG. 9, two units of magnetrons (13) are placed opposite to respective material targets (14). Magnetic flux lines (15) are arranged abreast crosswise to form a closed circuit emanating from N poles and ending in S poles to take a balanced mode of magnetic flux distribution. In the device, two targets (14), (14) of the two units of magnetrons are placed to be abreast on the same plane.

An alternate electric power having a desired waveform and frequency is applied between the two units of magnetrons (13) to elicit sputtering. Then, a material constituting target (14) is turned into material vapor (17) which is released into the chamber of the device to deposit on a substrate (16) to form a film there as intended, at a higher speed than is possible with a single magnetron sputtering device.

However, with a conventional dual magnetron device, it is difficult to form a film with well-oriented crystals while keeping the target at a low temperature, or more typically not heating the target in any way, particularly when the material consists of an inorganic material having a high melting point. For example, even if it was tried to prepare a film of titanium oxide which has a photocatalytic activity on a substrate kept unheated, the trial has never met success.

Therefore, it has been impossible to form, without heating, a film of titanium oxide having a photocatalytic activity on a substrate made of a material having a low melting point represented by polyethylene terephthalate which, on account of restrictions imposed by the physical property of the material, requires non-heating film formation.

The merit of dual magnetron sputtering includes the rapid formation of a film. However, if the formation of a film of titanium dioxide which will normally have an excellent photolytic activity occurs on a glass substrate with heating at a deposition speed of 20 nanometer or more per minute, the resulting film of titanium dioxide will not exhibit an excellent photocatalytic activity characteristic with titanium dioxide.

To obtain a substrate coated with a film of titanium dioxide exhibiting an excellent photocatalytic activity characteristic with titanium dioxide, it is necessary not only to select an appropriate material for the substrate, but also to reduce the speed of film formation, which spoils the merit inherent to dual magnetron sputtering.

DISCLOSURE OF THE INVENTION

Problems to be Solved by the Invention

A first object of this invention is to simplify the designing of a sputtering device that gives a desired configuration of magnetic field which has hitherto required much labor and ample experience, and to provide a film formation method allowing the formation of an inorganic film coated material over a wide temperature range, utilizing a magnetron sputtering device in which the balanced mode and unbalanced one can be freely selected by switching.

A second object of this invention is to provide a dual magnetron sputtering device allowing the rapid formation of a film over a wide temperature range, and a film formation method allowing the rapid formation of an inorganic film coated material over a wide temperature range, utilizing a dual magnetron sputtering device as described above.

Means for Solving Problem

To attain the above objects, the present inventors studied hard and found that the object related with the first aspect of the invention can be readily achieved, when for example it is required to alter the operation of a sputtering device from the balanced mode to unbalanced one, by placing a magnetic field adjusting member such as a ferromagnetic body close to a target mounted on a backing plate (5).

Specifically, the inventors found it is possible to readily alter the operation mode of a sputtering device. The balanced mode of operation is taken as a standard. Then, alteration of the operation from the balanced mode to unbalanced one can readily be achieved by attaching a ferromagnetic body (8) close to a target (4) as shown in FIG. 4, and adjusting it or replacing an old ferromagnetic body with a new one. According to this method of altering the operation mode, the magnetic field design is essentially determined by the existing magnet assembly (7) in which magnets (6) have been arranged to produce a balanced distribution of magnetic fluxes. Even when the operation is altered from the balanced mode to unbalanced one (or vice versa), it is not necessary to separate a backing plate, cooling water pipes, and a power cable from the magnet assembly, modify them to match the unbalanced mode of operation, and reattach them to the device as with a conventional magnetron sputtering device.

The present inventors made a further finding. According to the method based on the finding, it is not necessary to carry out a special operation necessary for inserting a ferromagnetic body (8) into a gap between a magnet (6) and a backing plate (5) as shown in FIG. 3. Namely, the device can readily be altered to the unbalanced mode of operation while it maintains essentially the same configuration as in the balanced mode of operation.

The object related with the second aspect of the invention concerns a dual magnetron sputtering device. In relation to this object, the inventors found that a highly active focus (19) of plasma is localized in a comparatively narrow zone nearly at a middle point between two units of magnetrons (13) (see FIG. 9).

Considering, by creating such a highly active focus of plasma deliberately and making the most of it, it would be possible to manage to perform film formation under a stable condition, even when film is formed rapidly at a low temperature, the inventors continued the research.

As a result of this research effort, the inventors found that more effective activation of material vapor in plasma in a dual magnetron sputtering device can be achieved by rotating the planes sustaining two units of magnetrons with respect to each other such that the two axes normal to the planes intersect with each other at a certain appropriate angle, and that use of a mixture gas comprising two rare gases as a sputtering gas contributes to the formation of an active focus of plasma which will promote the rapid formation of a film at a low temperature (FIGS. 10 and 13).

Certainly there are some among conventional dual magnetron sputtering devices that are configured, being forced by some mechanical restrictions or other, to have two units of magnetrons (13) slanted towards each other. However, this configuration has never been adopted as a result of some idea or design concept which is derived from recognition: there is a highly active focus of plasma in a comparatively narrow zone (equal in size to a cube having a side of several centimeters) at a middle point between two units of magnetrons (1); it is necessary to exactly determine the location of the focus (19); and it will be advantageous to cause two main currents (18) of material vapor discharged from the two units of magnetrons with a certain angle between them to flow through the active focus (19) of plasma. Thus, the conventional devices in question can never achieve the rapid formation of a film at a low temperature, because they have never been designed to give optimum condition and environment to attain the target here concerned.

To achieve the feature of the invention, only slanting two units of magnetrons (13) towards each other is not adequate. According to the invention, it is necessary to select an optimum slanting angle, and for this purpose it is necessary to exactly determine the location of the active focus, and adjust the configuration of involved elements to allow two currents of material vapor to pass through the active focus to impinge on a substrate. It should be understood that the basic design concept of the inventive device is quite different from the design concept of the apparently similar conventional devices as described above.

Of course, the optimum slanting angle may vary greatly depending on involved parameters of a given device, including the size and shape of the device, distance between a substrate (17) and a magnetron (13), distance between two units of magnetrons (13), etc. Thus, it is difficult to determine an optimum slanting angle for a given device uniquely in terms, for example, of a certain distance parameter within the device. In practice, it is necessary to determine an optimum slanting angle individually for each device based on the above design concept.

However, with the most commonly available dual magnetron sputtering devices, the optimum slanting angle may fall within a range of 90°±45°. With specially configured dual magnetron sputtering devices, the angle in question may fall within a range of 90°±70°.

The inventors further found that it is possible to expand the area of an active focus (19) of plasma and raise the activity of the focus by slanting two units of magnetrons towards each other so that two currents (18) of material vapor radiated by the magnetrons (13) can merge with each other on a substrate (17).

The angle between two units of magnetrons, distance between a substrate (17) and a magnetron (13), and distance between the two magnetrons (13) may vary from one device to another. However, generally an ordinary device configured according to the invention will have involved elements arranged as shown in FIG. 12.

Referring to FIG. 12, the involved elements of a dual magnetron sputtering device are configured so that an angle formed between two lines one extending from the surface of material target (14) of one magnetron (13) and the other extending from the surface of opposite target (14) of the other magnetron (13) falls within a range of 160 to 20°, preferably 160 to 70°, and that an intersection region (23) where, for a pair of closely apposed erosion zones (21), one columnar projection from the surface of erosion zone of one magnetron, whose periphery corresponds with that of said surface and whose direction is normal to said surface, and the counterpart from the surface of erosion zone of the other magnetron cross with each other, can fall totally or partially upon the surface (17) of a substrate where a film is to be formed, and allowing a film to be formed there.

An inventive dual magnetron sputtering device prepared based on the design concept as described above where two magnetrons are arranged to meet the aforementioned requirements with respect to the location of a target is not only effective for forming a film possessed of high quality crystals at a low temperature but is also compatible with continuous film formation by sputtering which is mandatory for mass production.

Specifically, referring to FIG. 10 (or FIG. 13), it is readily possible to continuously form films on a substrate by attaching, to a sputtering device, a conveyor mechanism for carrying a substrate horizontally (for example, from the right to left of the figure).

The first requirement is the determination of an optimum angle between two units of magnetrons as described above. The second requirement is based on a further finding made by the inventors. They found it is possible to effectively moderate the confinement of plasma to the surface of a target (14) for one or both of two magnetrons (13), by altering arrangement of the magnetron so as to allow it to generate magnetic fluxes (20) having an unbalanced distribution.

When confinement of a plasma to the surface of a target is moderated, the plasma (not shown) tends to spread towards a substrate (17). As a result, the active focus (19) of the plasma is also expanded, which may lead to the enhanced activation of material vapor in plasma. This probably explains the reason why the rapid formation of a film at a low temperature becomes possible under this condition.

Care must be paid to the fact that an optimum result will be obtained at a certain degree of imbalance in the distribution of magnetic fluxes (the intensities of magnets should be adjusted such that not all magnetic fluxes emanating from N poles return to S poles, but part of the fluxes is dispersed diffusely into a three-dimensional space). In any case, setting up an unbalanced magnetic field will reduce the density of plasma close to the surface of a material target, which reduces the speed with which a film is formed. Of course, reducing the speed of film formation unduly will be disadvantageous. Thus, there is another optimum point in terms of the speed of film formation for the degree of magnetic flux imbalance.

It should be also taken into account that alteration of the magnetic flux distribution may greatly increase the expanse of plasma, or reduce the area of active focus of plasma, or even annihilate the active focus. The optimum degree of imbalance in magnetic flux distribution is not limited in a certain range, but should be determined individually for each device. To obtain a device giving an unbalanced magnetic flux distribution, it is most preferred to utilize the procedures disclosed herein in relation to the first aspect of the invention.

The third requirement is the use of a gas mixture comprising two or more rare gases as a sputtering gas. Sputtering consists of impinging rare gas particles onto a material target to release material vapor therefrom as a result of the exchange of momentum. For this purpose, argon gas has been used in an overwhelmingly majority of cases. The role of the sputtering gas is to effectively drive out material vapor from the surface of a material target via the exchange of momentum, while avoiding the entrapment by a forming film, and maintaining sputtering plasma.

To meet the requirement that the sputtering gas must avoid entrapment by a forming film, gases suitable for the sputtering gas are limited to rare gases such as helium, neon, argon, krypton, xenon, and radon. It is not a mere exaggeration to say that argon has been almost exclusively used as sputtering gas, because it is cheap, has an atomic weight comparable to other elements used in association, and can efficiently drive out material vapor via the exchange of momentum (see "Glow Discharge Processes," p. 203, Chapman, John Willey & Sons, 1980).

As long as the sputtering gas is selected on the condition that it can efficiently vaporize a target material to maintain thereby plasma, the sputtering gas solely comprising argon will be adequate for all purposes. Being based on such a point of view, no noteworthy study has been made on a sputtering gas comprising a mixture of gases, its design, and interaction of those gases.

Contrary to this tendency, the present inventors have paid their attention to the fact that the atom of a rare gas acting as a sputtering gas has a unique excitation level characteristic with the gas atom (for example, argon gas comprises argon atoms having the same excitation level unique to the atom, and exchanges energies corresponding to that energy level with electrons and other particles in plasma). The overall activity of a plasma including its focus is determined by the excitation levels of particles involved in the plasma.

If a plasma is derived from a sputtering gas consisting solely of argon gas, only the excitation level of argon atom exists in the plasma, and the overall activity of the plasma is determined solely by the aforementioned excitation level of argon atom.

Let's assume an alternative case where a mixture gas comprising two or more gases chosen from helium, neon, argon, krypton, xenon, and radon is used as a sputtering gas. Then, in a plasma derived from the sputtering gas, concomitantly generated are multiple excitation levels, for example, of neon, argon, etc. Those excitation levels are naturally different, and the overall behavior of the plasma including its activity is determined by those multiple excitation levels.

The present inventors confirmed use of a gas mixture comprising two or more rare gases is more effective for the rapid formation of a film at a low temperature, as compared with the film formation performed in a sputtering gas comprising a single rare gas. Use of a rare gas mixture may also be effective for increasing the activity of plasma, that is, for further enhancing the activity of plasma focus (19) as shown in FIG. 10.

The aforementioned mechanism, however, is not yet sufficiently clear at the present state of knowledge, and awaits further studies. It is speculated, however, that, when a rare gas mixture is used as a sputtering gas, multiple excitation levels are generated in plasma which will more effectively increase the freedom of energy with which particles of plasma interact, and improves the efficiency of energy exchange among particles and leads to the enhanced activity of plasma, as compared with a case where a single rare gas is used as a sputtering gas.

The effect obtained from a sputtering gas comprising a gas mixture is more conspicuous as the number of rare gases mixed becomes more, because then the freedom of energy becomes more enhanced. The mixture ratios of individual gases are not limited to any specific range, and can be varied widely. However, a gas mixture comprising helium and neon, that is, atoms having a comparatively small atomic weight where helium and neon account for 80% or more in volume should be avoided except for some special applications, because in such a sputtering gas the formation of a film will be unduly retarded.

When a gas mixture comprising, for example, two rare gases is used as a sputtering gas, and it is necessary to determine the optimum ratio of two gases, the most efficient method is to prepare as many rare gases as possible, to take a combination of any two gases out of them in equal volumes, to see the effect of the combined gas on film formation, and to increase or decrease the flow amount of one or the other gas depending on the result of film formation until an optimum condition for film formation is obtained.

Use of a gas mixture as a sputtering gas also enhances the activity of an active focus (7) of plasma.

Of the three requirements mentioned above, a dual magnetron sputtering device will have its film formation improved by only meeting the first requirement. However, it is more preferable for the device to meet a combination of any two out of the three requirements, or rather all the three requirements as a whole than to meet any single one out of the three requirements, because then the device will be able to exert excellent effects, to allow a highly functional film to be rapidly produced at a low temperature.

The present invention has been achieved based on widely varied findings, and its features are roughly classified to two aspects of which one is described in following paragraphs (1) to (8), and the other in paragraphs (9) to (19).

A first aspect of the invention: (1) a magnetron sputtering device in which a sputtering cathode is arranged to produce a balanced distribution of magnetic fluxes and in which the balanced mode can be converted into an unbalanced mode by placing an article that exhibits ferromagnetism at room temperature, onto or close to the surface of the sputtering cathode for holding a material target, and the unbalanced mode can be reconverted into the balanced mode by removing the ferromagnetic article.

(2) The magnetron sputtering device as described in paragraph (1) in which the sputtering cathode is arranged to produce a balanced distribution of magnetic fluxes and an element has been placed onto the surface of the sputtering cathode for holding a material target, and in which the magnetic flux distribution can be converted from the unbalanced mode to the balanced one or vice versa, by replacing the element with another element made of a material that exhibits ferromagnetism at room temperature.

(3) The magnetron sputtering device as described in paragraph (2) in which the element placed on the surface of the sputtering cathode for holding a material target is any one chosen from a middle pole, a middle pole cover, and an insulating body.

(4) The magnetron sputtering device as described in paragraph (3) in which the sputtering cathode arranged to produce a balanced distribution of magnetic fluxes is a square-shaped sputtering cathode.

(5) A film formation method for forming an well-crystallized film from an inorganic film formation material using a magnetron sputtering device, the method comprising selecting an unbalanced type magnetron sputtering device as described in any one of paragraphs (1) to (4), thereby enabling a film to be formed over a wide temperature range on a substrate whose melting point falls between a low and high temperature.

(6) The film formation method as described in paragraph (5) for forming a well-crystallized film from an inorganic film formation material, wherein the substrate is an organic polymer sheet.

(7) The film formation method as described in paragraph (5) or (6) for forming a well-crystallized film from an inorganic film formation material, wherein the inorganic film formation material is any one metal chosen from titanium, aluminum, zirconium, zinc, tin, indium, silicon, tantalum, bismuth, copper, boron, carbon, vanadium, manganese, tungsten, molybdenum, barium, strontium, yttrium, and niobium, and their oxides, nitrides, and borides.

(8) The film formation method as described in paragraph (7) for forming a well-crystallized film from an inorganic film formation material, wherein the oxide is titanium dioxide having a high photocatalytic activity.

A second aspect of the invention: (9) A dual magnetron sputtering device in which two magnetrons are slanted towards each other so that an angle formed between two lines one extending from the surface of a material target of one magnetron and the other from the surface of a material target of the other magnetron falls within a range of 160 to 20°, preferably 160 to 70°, to allow an active focus of plasma to converge onto the surface of a substrate, thereby enabling the high speed formation of a film there at a low temperature.

(10) The dual magnetron sputtering device as described in paragraph (9) wherein the two magnetrons are set to produce an unbalanced distribution of magnetic fluxes.

(11) The dual magnetron sputtering device as described in paragraph (9) or (10) wherein gas to be introduced into the dual magnetron sputtering device comprises at least two gases chosen from helium, neon, argon, krypton, xenon, and radon.

(12) A film formation method for forming a film from an inorganic film formation material using a dual magnetron sputtering device, the method comprising disposing the two magnetrons with respect to each other such that, when the surface of a target of each magnetron being taken as a reference, an angle formed between the two reference lines one extending from the surface of a target of one magnetron and the other from the surface of a target of the other magnetron falls between 160 and 20°, and that an intersection region where, for a pair of closely apposed erosion zones out of plural erosion zones developed on the two targets, one columnar projection from the surface of erosion zone of one magnetron, whose periphery corresponds with that of said surface and whose direction is normal to said surface, and the counterpart from the surface of erosion zone of the other magnetron cross with each other, falls totally or partially upon the surface of a substrate where a film is to be formed, and allowing a film to be formed on the substrate.

(13) The film formation method as described in paragraph (12) for forming a film from an inorganic film formation material using a dual magnetron sputtering device wherein the dual magnetron sputtering device has been set to produce an unbalanced distribution of magnetic fluxes.

(14) The film formation method as described in paragraph (12) or (13) for forming a film from an inorganic film formation material wherein gas to be introduced into the dual magnetron sputtering device comprises at least two chosen from helium, neon, argon, krypton, xenon, and radon.

(15) The film formation method as described in any one of paragraphs (12) to (14) for forming a film from an inorganic film formation material wherein an organic polymer sheet is used as a substrate and film formation is performed at a low temperature.

(16) The film formation method as described in paragraph (15) for forming a film from an inorganic film formation material wherein the organic polymer sheet is a polyethylene terephthalate polymer sheet.

(17) The film formation method as described in any one of paragraphs (12) to (14) for forming a film from an inorganic film formation material wherein glass is used as a substrate, and a film formed on the glass.

(18) The film formation method as described in any one of paragraphs (12) to (17) for forming a film from an inorganic film formation material wherein the inorganic film formation material is any one inorganic material chosen from carbon, metals, oxides, nitrides, carbides, and borides.

(19) The film formation method as described in paragraph (18) for forming a film from an inorganic film formation material wherein the oxide is titanium dioxide having a high photocatalytic activity.

Effect of the Invention

According to the first aspect of the invention, it is possible to convert the balanced type of magnetic field arrangement to the unbalanced one or vice versa by simply placing one or two or more easily accessible elements on a backing plate or on a target mounted to the backing plate, or replacing an existing element(s) by one or two or more such elements. Thus, it is possible to dispense with the disassembling and reassembling pipes and magnet assembly which are required for a conventional magnetron sputtering device each time the type of magnetic field arrangement must be altered, and to greatly reduce the time necessary for conversion of the type of magnetic field arrangement. Thus, according to the first aspect of the invention, it is possible to reduce the time necessary for switching between the balanced and unbalanced types of magnetic field arrangement to as short as several minutes, which will greatly improve the efficiency with which research or production is advanced.

Particularly to provide an optimum magnetic field arrangement, it is necessary to repeat an operation comprising a series of procedures such as determination/adjustment of the intensities of individual magnets, adjustment of the position and size of a ferromagnetic body, and its attachment. Thus, it is not a mere exaggeration to say that it would be essentially impossible to provide an optimum magnetic field arrangement within a period practically acceptable without the tactics provided by the invention. In that respect, simplification of the work necessary for providing an optimum magnetic field arrangement enabled by the invention is particularly significant.

Conventionally, switching from the balanced type of magnetic field arrangement to the unbalanced one is achieved by inserting a ferromagnetic body into a gap between a backing plate and a magnet, but the gap is often too narrow to receive a required ferromagnetic body which poses a problem. In contrast, according to the invention, such a ferromagnetic body may be placed on a target or backing plate within a wide vacuum chamber, instead of a narrow space between a backing plate and a magnet, and thus is free from the problem observed in a conventional device.

A dual magnetron sputtering device prepared according to the second aspect of the invention wherein two magnetrons are simply disposed with respect to each other such that an angle formed between two lines one extending from the material holding surface of one magnetron and the other from the material holding surface of the other magnetron can fall within a specific range, wherein the atmosphere comprises a gas mixture, and wherein the cathodes are designed to produce an unbalanced distribution of magnetic fluxes, allows a well-crystallized film to be formed rapidly at a low temperature over a plastic substrate without suffering from the damage of crystals, as compared with a conventional dual magnetron sputtering device where the two material holding surfaces of two magnetrons are disposed side by side on the same horizontal plane, because with the inventive dual magnetron sputtering device, an active focus of plasma is expanded, and material vapor released from the material targets is broadly activated.

What is particularly noteworthy is that it is possible according to the invention to form a film comprising polycrystal titanium dioxide having an excellent photocatalytic activity on an unheated substrate, a feat which has never been achieved by any known sputtering including dual magnetron sputtering.

Another feature to be noted in relation to the invention is the speed of film formation. Importantly, according to the method of the invention, the titanium dioxide film, despite that it has a thickness of 40 nm which is sufficiently thin to allow the rapid formation of film suitable for mass production, still exhibits an effective photocatalytic activity. The crystal structure of the thin film is of anatase type which is believed to exhibit a highest photocatalytic activity. With regard to uniformly oriented crystals, the c-axis of crystal lattice is disposed normal to the surface of substrate, indicating that the film has an excellent photocatalytic activity, in spite of its being formed under an unheated condition. This feature represents the most spectacular merit of the invention.

Still further, the invention provides a technique which for the first time enables the practical production of a compound product obtained by coating the surface of a heat-labile sheet made, for example, of plastic such as polyethylene terephthalate (PET) with a film having a photocatalytic activity, thereby conferring the sheet the properties characteristic with a photocatalyst material such as defrosting, soil resistance, ultra-high hydrophilic activity, etc.

The effectiveness of the inventive technique has been proved only for a small pilot device. However, since sputtering permits ready scaling-up as its notable characteristic feature, it will not be a mere exaggeration to say that the inventive method will open up, in the market, a new gigantic field dealing with construction materials incorporating "plastic materials having a photocatalytic activity."

As stated above, the most remarkable feature of the invention is to allow the high speed formation of a film made of titanium dioxide having a photocatalytic activity on an unheated substrate. However, the inventive method can also be applied as effectively for the formation of a titanium dioxide film on a heated substrate. Thus, in this case too, a film exhibiting an excellent crystallization as well as a high photocatalyst activity will be obtained.

This feature is all the more notable because a conventional dual magnetron sputtering device allows the rapid formation of a film having a thickness of 20 nm only after heating a substrate to about 300° C., and the resulting film having hardly any crystals exhibits only a weak photocatalytic activity. In view of this, in place of currently marketed goods called photocatalytic glass products which have been produced by heating substrate to several hundred degrees Centigrade, it will be possible to provide, by using the inventive method and device, similar photocatalystic glass products which are, however, by far excellent in performance.

It has been stressed above and supported by the Examples given below that the inventive method is particularly effective for forming a thin film made of titanium oxide. Needless to say, however, the inventive method is effective for the formation not only of a film of titanium oxide or like compounds, but also of a film of any compounds widely differed, as long as the compound allows the formation of a film by sputtering, particularly when it is required to form, at a low temperature, a film which exhibits excellent crystallization and membrane performance. Specifically, the inventive method allows the high speed and low temperature formation of a film of alpha alumina or other similar compounds which usually require, as an essential condition, heating as high as 1000° C. or more for film formation.

Figure 1:
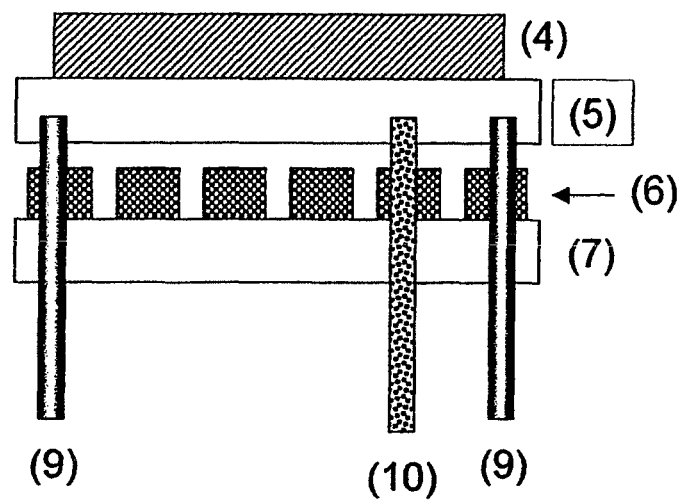
FIG. 1 is a schematic diagram of the cathode of a conventional magnetron sputtering device which has been arranged to produce an balanced distribution of magnetic fluxes.
Figure 2:
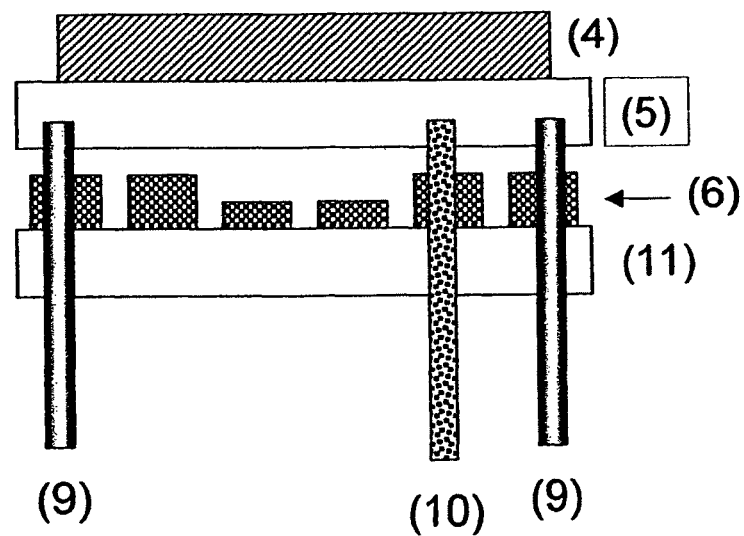
FIG. 2 is a schematic diagram of the cathode of a conventional magnetron sputtering device in which the intensities and positions of individual magnets are altered to produce an unbalanced distribution of magnetic fluxes according to a conventional method.

REFERENCE NUMERALS (1) Middle pole cover
(2) Middle pole
(3) Insulating body
(4) Material target
(5) Backing plate
(6) Magnet
(7) Balanced type magnet assembly
(8) Ferromagnetic article
(9) Cooling water pipe
(10) Power cable
(11) Unbalanced type magnet assembly
(12) Ferromagnetic middle pole cover
(13) Dual magnetrons
(14) Dual material targets
(15) Balanced distribution of magnetic fluxes for dual magnetrons
(16) Shield for dual magnetrons
(17) Substrate

(18) Predominant current of material vapor
(19) Highly active focus
(20) Unbalanced distribution of magnetic fluxes for dual magnetrons
(21) Erosion zone
(22) Columnar projection from erosion zone in a direction normal to the latter
(23) Intersection area formed between a pair of columnar projections most closely apposed to each other.

BEST MODE FOR CARRYING OUT THE INVENTION

The embodiments of the present invention will be described below with reference to attached drawings and Examples. It should be understood, however, that the following description will be given for illustrating the invention to be legible to readers, and not for limiting the scope of the invention. Namely, modification of the embodiments including the conditions under which the embodiments are practiced will be possible, as long as the modification does not alter the spirit of the invention, and such modifications are naturally included within the scope of the invention.

Embodiments Representing the First Aspect of the Invention

Figure 4:
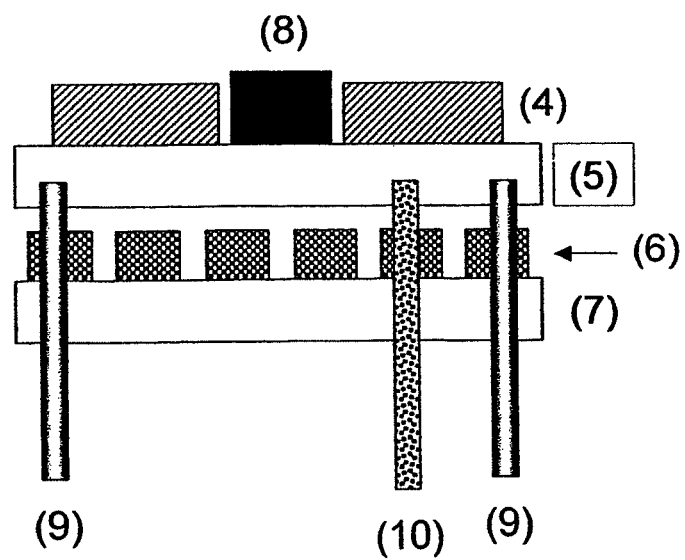
FIG. 4 is a schematic diagram of the cathode of an inventive magnetron sputtering device in which conversion of a balanced magnetic field arrangement to an unbalanced one is achieved by placing a ferromagnetic body on a surface of a backing plate to which a material target is attached.

FIG. 4 is a schematic diagram of the cathode of an inventive magnetron sputtering device in which conversion of a balanced magnetic field arrangement to an unbalanced one is achieved by placing a ferromagnetic body on a surface of a backing plate to which a material target is attached.

Figure 5:
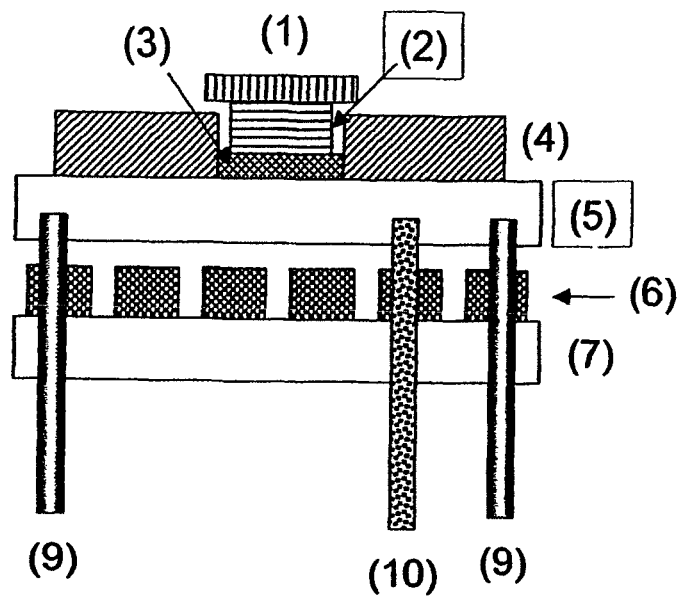
FIG. 5 is a schematic diagram of the cathode of a magnetron sputtering device embodying the invention in which arrangement to produce a balanced magnetic field is achieved by placing a ferromagnetic body on a surface of a backing plate to which a material target is attached, as in the sputtering device manufactured by Fraunhofer Institute, Germany.

FIG. 5 is a schematic diagram of the cathode of a magnetron sputtering device in which arrangement to produce a balanced magnetic field is achieved by placing a ferromagnetic body on a surface of a backing plate to which a material target is attached, as in the sputtering device manufactured by Fraunhofer Institute, Germany.

Figure 6:
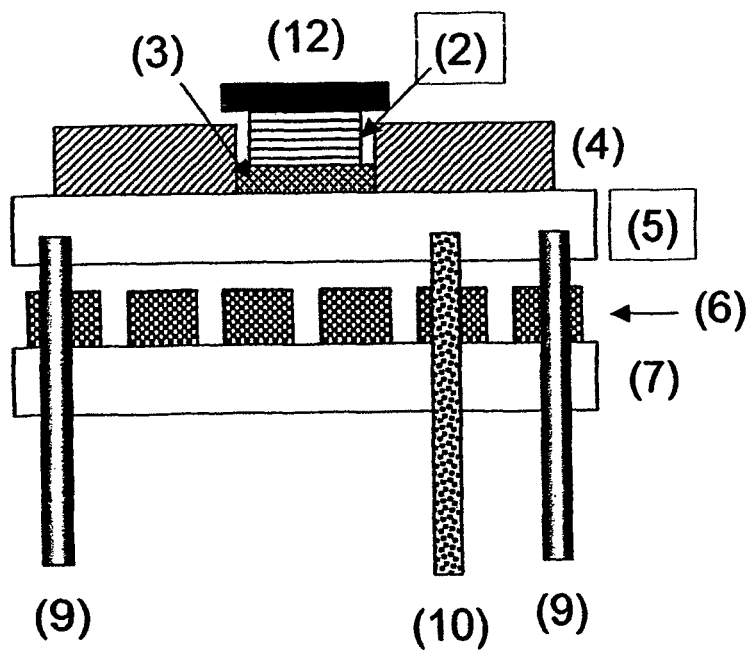
FIG. 6 is a schematic diagram of the cathode of a magnetron sputtering device embodying the invention shown in FIG. 5 in which conversion of a balanced magnetic field arrangement to an unbalanced one is achieved by replacing only a middle pole cover with another middle pole cover made of iron (ferromagnetic at room temperature).

FIG. 6 is a schematic diagram of the cathode of an inventive magnetron sputtering device as shown in FIG. 5 in which conversion of a balanced magnetic field arrangement to an unbalanced one is achieved by replacing only a middle pole cover with another middle pole cover made of iron (ferromagnetic at room temperature).

Referring to FIG. 4, the cathode is constituted of a backing plate (5), magnets (6), and a magnet assembly (7) which are arranged in the same manner as in a conventional magnetron sputtering device in which the cathode is arranged to produce a balanced magnetic field. Thus, an element (8) made of a ferromagnetic material is mounted on the surface of backing plate (5) beside a material target. In FIG. 4, the ferromagnetic element is mounted to backing plate (5). However, the ferromagnetic element may be mounted onto the material target itself.

Among conventional magnetron sputtering devices, there are some that, in the design of their cathode configuration, adopt the same design as that observed in the magnetron sputtering device manufactured by Fraunhofer Institute of Germany (FIG. 5). Namely, the cathode is designed to comprise additional elements such as a middle pole cover (1), middle pole (2), and insulating body (3) arranged on a backing plate (5) beside a material target. Those magnetic sputtering devices have been accepted as a powerful machine in the market. These additional elements (1), (2), and (3), however, are originally provided to inhibit aberrant discharges which would otherwise occur during film formation, and have never been provided, according to the intention underlying the initial design, to utilize them as means to alter the configuration of magnetic field.

Namely, according to the initial design, the middle pole cover (1), middle pole (2) and insulating body (3) are all constituted of materials that do not exhibit ferromagnetism at room temperature. According to the present invention, any one or two chosen from these three elements or all the three elements are made of materials having a ferromagnetism at room temperature, and their thickness and shape may also be modified as appropriate. It is also possible to place a ferromagnetic body in addition to these elements to thereby alter the configuration of magnetic field so as to convert a balanced distribution of magnetic fluxes into an unbalanced one.

If it is required to reconvert the unbalanced type of magnetic field arrangement now obtained into the balanced one, it is only necessary to replace the ferromagnetic body with another body made of a material that does not exhibit ferromagnetism at room temperature.

Example 1

A magnetron sputtering device of this example in which the cathode has been arranged to produce a balanced magnetic field uses, as its cathode, an RMS-200 type cathode designed/manufactured by Fraunhofer Institute, Germany.

The outline of the device is as shown in FIG. 5. In the cathode arranged to produce a balanced magnetic field, the additional elements are a middle pole cover (1) and middle pole (2) both of which are made of stainless steel which does not exhibit ferromagnetism at room temperature, and a ferromagnetic body (3) constituted of a mica plate. To modify the cathode so as to produce an unbalanced magnetic field (FIG. 6) instead of the balanced magnetic field, in this particular example, the middle pole cover (1) was replaced by another middle pole cover made of a material which exhibits ferromagnetism at room temperature, specifically an iron-made middle pole cover (12). The middle pole cover (1) and ferromagnetic middle pole cover (12) had the same size (about 10×3×0.5 cm), and had the same shape and thickness.

However, it is also possible to alter the intensity of an unbalanced magnetic field by changing the shape and thickness of any additional element, thereby modifying the property of a resulting film.

In this particular example, the middle pole (2) and insulating body (3) used in the cathode arranged to produce a balanced magnetic field were use as they were. However, they may be replaced as appropriate by alternative elements made of ferromagnetic materials, and it is possible by so doing to expand the range within which the property of a film can be changed.

Figure 7:
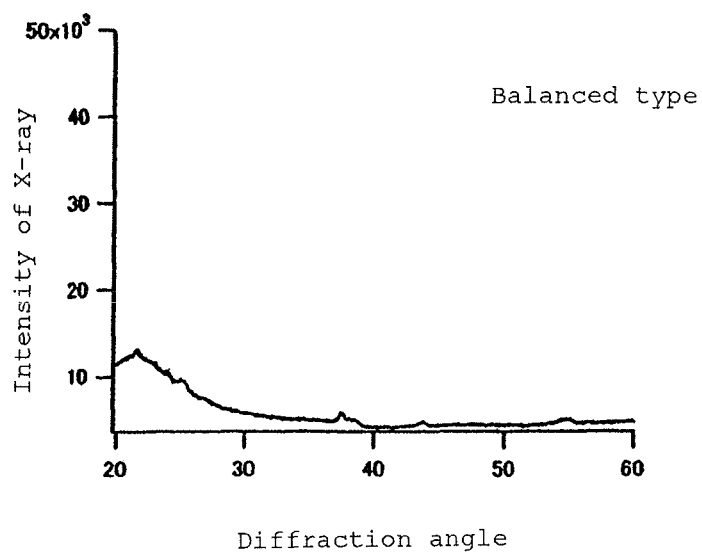
FIG. 7 shows an X-ray diffraction pattern of a titanium oxide film formed via a sputtering cathode arranged to produce a balanced magnetic field as shown in FIG. 5.
Figure 8:
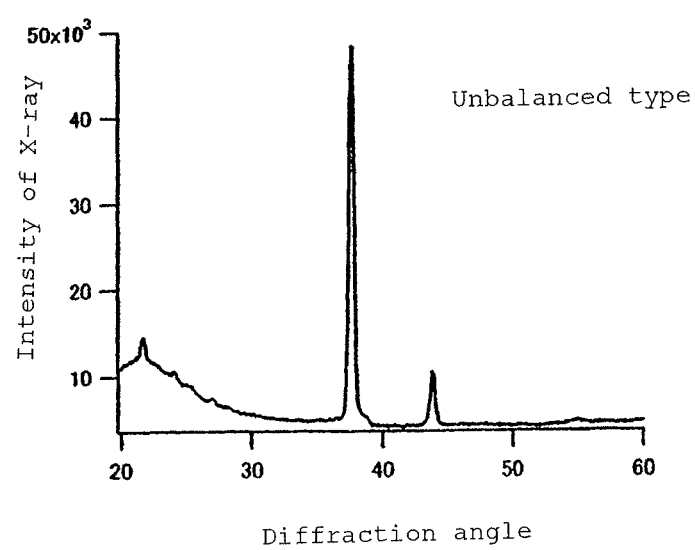
FIG. 8 shows an X-ray diffraction pattern of a titanium oxide film formed via a sputtering cathode arranged to produce an unbalanced magnetic field as shown in FIG. 6.
Figure 9:
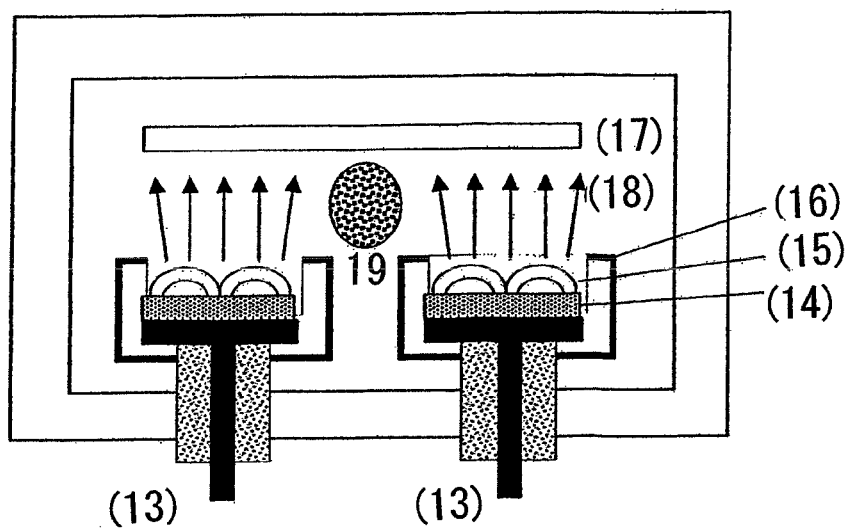
FIG. 9 is a schematic diagram of a conventional dual magnetron sputtering device.

FIGS. 7 and 8 show X-ray diffraction patterns of titanium oxide films formed by RMS-200 type sputtering cathodes arranged to produce a balanced magnetic field and unbalanced magnetic field, respectively.

The two sputtering cathodes were identical except that the balance type cathode included a middle pole cover made of stainless steel while the unbalanced type cathode a middle pole cover made of iron. The condition for film formation was as follows: atmosphere, 0.5 Pa argon; flow of oxygen, 7 cc/min; driving power, 3 kW, 50 kHz square pulses; and heating of substrate, 300° C.

In a magnetron sputtering device in which the cathode is arranged to produce a balanced magnetic field, the diffraction peak due to titanium oxide is very weak in intensity, although it is observable. In contrast, in a magnetron sputtering device where the cathode is arranged to produce an unbalanced magnetic field, the diffraction peak due to titanium oxide is strong and marked, which clearly indicates the characteristic feature of an unbalanced type magnetron sputtering device which allows the formation of a well crystallized film at a low temperature. This serves as a powerful evidence for demonstrating the effectiveness of the present invention, and confirms the well-controlled switching of magnetic field arrangement from the balanced type to the unbalanced one and vice versa in an magnetron device prepared according to the invention.

Switching of magnetic field arrangement from the balanced type to the unbalanced one or vice versa is achieved according to the invention by removing easily accessible several screws (not shown) which are attached to the surface of a backing plate, and then replacing an existing middle cover (1) with another appropriate middle cover, and completes in a few minutes, in contrast with a conventional device in which alteration of the magnetic field arrangement requires the removal/reconnection of water pipes (9), power cable (10), magnets (6), and magnet assembly (7) which will take a far longer time.

By using a magnetron sputtering device in which the cathode is arranged according to the invention, it is possible to obtain a well-crystallized film not only from titanium oxide but also from metals as described below, and their oxides and nitrides. The metals include titanium, aluminum, zirconium, zinc, tin, indium, silicon, tantalum, bismuth, copper, boron, carbon, vanadium, manganese, tungsten, molybdenum, barium, strontium, yttorium, and niobium, and their oxides and nitrides. The device prepared according to the invention is confirmed to be effective in the satisfactory formation of a film of any one material chosen from the above list. The inventive method, however, can be applied to any other molecule than those cited above, and application of the inventive method to a given molecule can be rejected for no justifiable reason.

Embodiments Representing the Second Aspect of the Invention

Next, embodiments representing the second aspect of the invention will be described with reference to attached drawings and Examples. It should be understood, however, that those embodiments will be given only for illustrating the invention, and that the scope of the invention will not be limited in any way by those examples.

Example 2

The dual magnetron sputtering device basically used in this example consists of an MLC-200 type dual magnetron sputtering device incorporating two units of RMS-200 type magnetrons designed/manufactured by Fraunhofer Institute, Germany.

Figure 10:
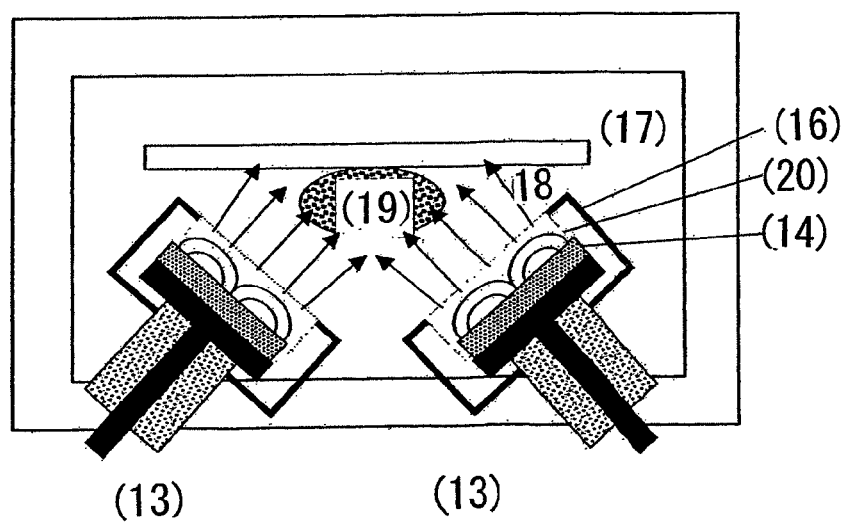
FIG. 10 is a schematic diagram of a dual magnetron sputtering device in which two magnetrons are disposed with respect to each other in accordance with the invention.
Figure 11:
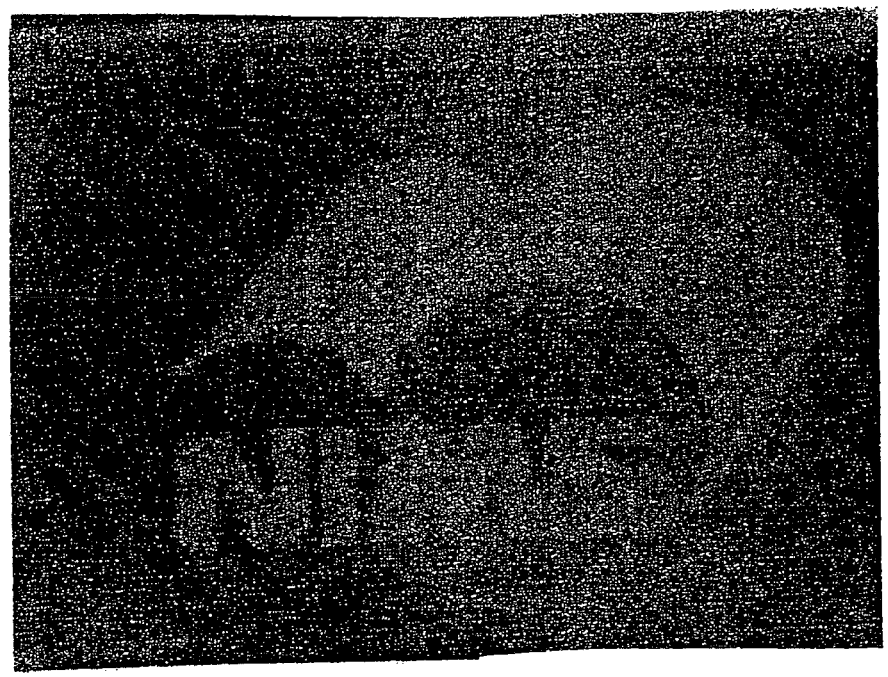
FIG. 11 shows an X-ray diffraction pattern of a titanium oxide film formed according to the invention on an unheated substrate consisting of a polyethylene terephthalate resin sheet.
Figure 12:
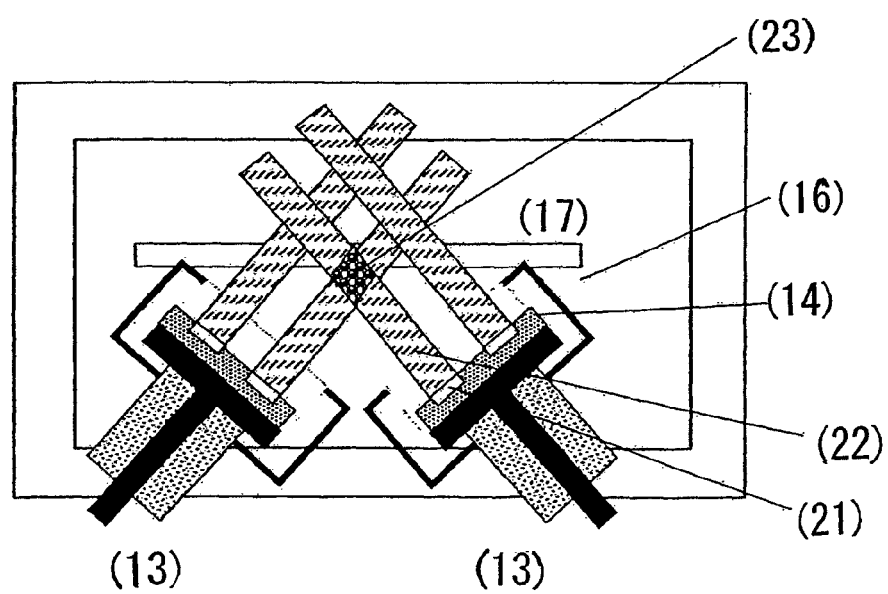
FIG. 12 is a photograph of a logo mark which is made visible on a titanium dioxide film by virtue of the photocatalytic activity of the film which has been formed by the inventive method on a polyethylene terephthalate resin sheet kept unheated.
Figure 13:
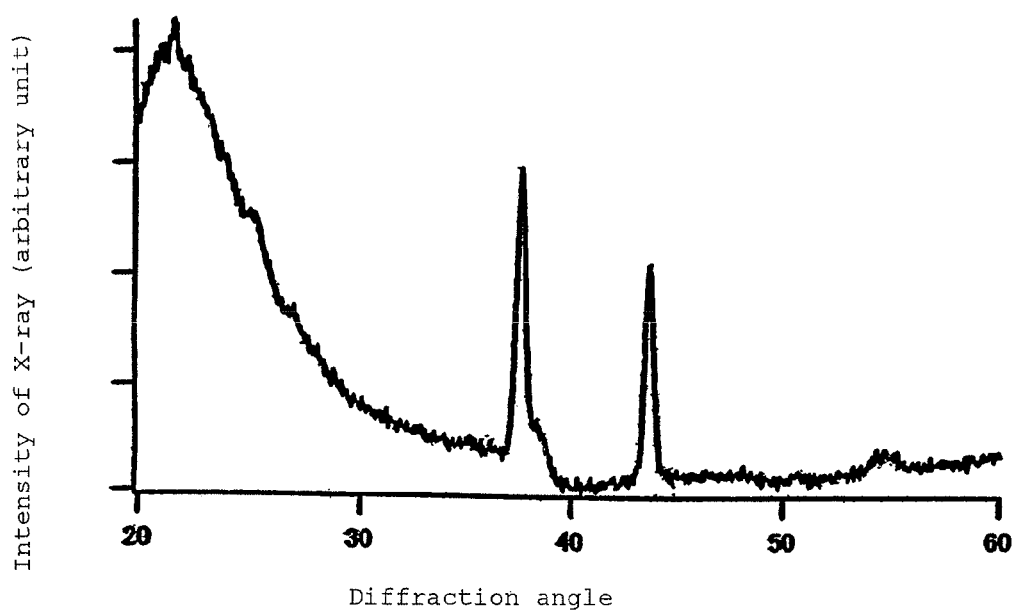
FIG. 13 is a diagram showing the positions of columnar projections from erosion zones relative to a substrate in a dual magnetron sputtering device of the invention.

As shown in FIG. 10, the two units of magnetrons (13) are slanted towards each other so that an angle is equal to 90° which is formed between the two lines one extending from the surface of material target of one magnetron and the other from the counterpart surface of the other magnetron, which enables two main currents of the material (18) from the respective magnetrons (13) can merge at a place on or close to the surface of a substrate (17). The distance between the center of the substrate and the center of each material target is 20 cm.

To convert, for the two units of magnetrons (13), a balanced distribution of magnetic fluxes into an unbalanced one (19), for each unit of magnetron, a non-magnetic middle pole cover (not shown) inherent to the RM-200 type magnetron (13) was replaced by an iron-made middle pole cover that exhibits ferromagnetism at room temperature and has the same size with that of the genuine middle pole cover: two ferromagnetic middle pole covers were set to the sites where the two genuine middle pole covers had been set in the RM-200 type magnetrons (13), in place of the latter.

Optimization of the convergence degree of magnetic fluxes (19) can be achieved readily and accurately as is known in the prior art by changing the size and shape of middle poles and other elements adjacent to them, or the materials constituting them, as has been described above in relation to the first aspect of the invention.

Since the details of the procedures taken for adjustment have been given above in relation to the first aspect of the invention, they will be omitted here.

What is noteworthy here is that the sputtering gas used for the dual magnetron sputtering device consists of a gas mixture. Specifically, the gas mixture was obtained by mixing three gas flows consisting of argon, krypton, and helium to give a gas mixture comprising the three gases at a 2:1:1 flow ratio. The gas mixture was introduced at 80 cc/min in overall flow into the device to give a pressure of about 0.5 Pa in the chamber of the device.

In each of the magnetrons (13), titanium metal was set as a material target (14). A 3 kW pulsed output was delivered at 50 kHz to each magnetron electrode (13) to evoke a sputtering plasma (not shown) close to the material target constituted of titanium metal, to sputter metal atoms.

Introduction of the gas mixture was adjusted to generate an overall flow of about 7 cc/min close to the surface of material target on each of the magnetrons (13). The substrate (16) consists of a sheet made of a polyethylene terephthalate resin having a thickness of 188 μm. An uncoated surface of the sheet comprising only pure polyethylene terephthalate was employed for a coating surface. The substrate was kept unheated, and thus a heater (not shown) set to heat the substrate was kept out of action.

Under the aforementioned condition, film formation was performed for 20 minutes. Then, a titanium oxide film having a thickness of about 800 nm was obtained. The film formation speed in this case was as high as 40 nm/min.

Figure 3:
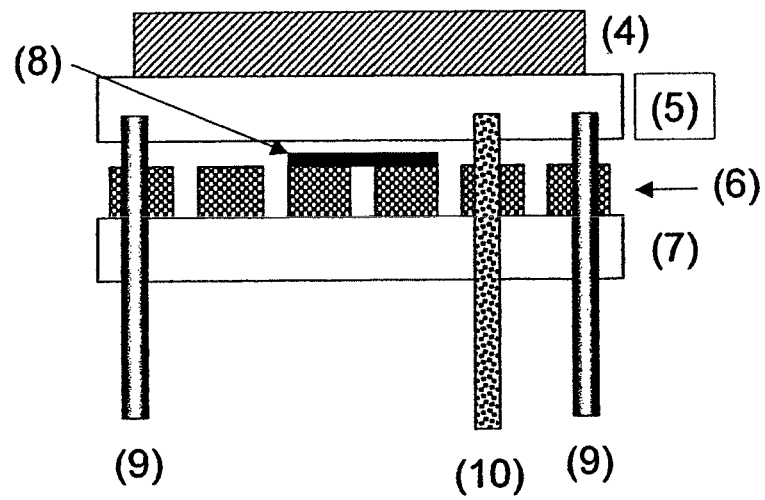
FIG. 3 is a schematic diagram of the cathode of a conventional magnetron sputtering device in which conversion of a balanced magnetic field arrangement to an unbalanced one is achieved by inserting a ferromagnetic body into a gap between a magnet and a backing plate according to a conventional method.

An X-ray diffraction pattern obtained from the film is shown in FIG. 3. The pattern shows a strong diffraction curve indicating that crystals have a clear $TiO_2$ anatase structure. In addition, the pattern emphasizes some diffraction curves with certain indices, which indicates that the $TiO_2$ anatase film exhibits excellent crystallization, and the c-axis of crystal lattice is disposed normal to the surface of substrate.

It has never been possible to obtain a film exhibiting such clear crystallization as this by using a dual magnetron sputtering device according to a conventional method, even when the film is formed on a glass substrate heated to 300° C. Also it has never been possible to obtain a titanium oxide film having a detectable photocatalytic activity by using a dual magnetron sputtering device according to a conventional method, even when the film is formed on a glass substrate heated to 300° C. It has been possible to obtain a titanium oxide film having a barely detectable photocatalystic activity only after an additional heating treatment consisting of heating to about 500° C. is introduced after film formation.

In contrast, a film with $TiO_2$ crystals having an anataze orientation formed on a polyethylene terephthalate substrate according to the inventive method exhibits a strong photocatalytic activity immediately after the non-heating film formation, and can eliminate the need for additional heating treatment. FIG. 4 shows the results of photocatalystic activity measurement performed on a film with $TiO_2$ crystals having an anataze orientation formed on a polyethylene terephthalate substrate according to the inventive method. The measurement was performed immediately after the non-heating film formation without any intervention of additional heating treatment.

A photo mask having a pattern representing a certain logo mark (NIMS) printed thereon was applied to the surface of a film with $TiO_2$ crystals having an anataze orientation, and the assembly was immersed in a 0.1 mol/L aqueous solution of silver nitrate, and exposed for 5 minutes to UV containing light guided via an optical fiber from a light source consisting of a 200 W xenon lamp.

Areas exposed to UV light had blackish silver films formed thereon as a result of photocatalytic activity of the film, while the remaining areas shielded against UV light had thereon the intact film with $TiO_2$ crystals having an anataze orientation, thus making the negative image of the logo mark clearly visible.

A comparable titanium oxide film was obtained by using a dual magnetron sputtering device according to a conventional method: the film was formed on an unheated substrate (5) and received no additional heating treatment. The film was submitted to the same measurement as described above, but did not show any photocatalytic activity.

As described above, it becomes possible according to the invention to form a photocatalytic film with $TiO_2$ crystals having an anataze orientation on an unheated substrate, a feat that has never been achieved by any conventional methods. A film obtained as described above according to the invention exhibits a higher photocatalytic activity than a comparable film obtained by a conventional method under heating to about 300° C. Namely, it is possible according to the invention to obtain a high performance film exhibiting a higher photocatalytic activity than does a comparable film obtained by a conventional method, even though film formation occurs according to the invention at a low temperature (under non-heating condition) which has been believed to be disadvantageous for the production of a film exhibiting well-formed crystallization and high performance.

INDUSTRIAL APPLICABILITY

It is expected that film formation technique will add to its importance as one of basic techniques in the future.

According to the first aspect of the invention, it is possible to readily switch, for a given magnetron sputtering device, the magnetic field arrangement from the balanced type to the unbalanced type or vice versa, and the switching operation can be performed rapidly and accurately. For a conventional magnetron sputtering device, the switching operation is so complicated that even those who have deep technical knowledge and skill have to spend considerable time and labor for the operation. In contrast, according to the method of the invention, it is possible even for a person having an ordinary skill in the field to readily alter the mode of magnetic field arrangement in a short period. The thus improved operability of a magnetron sputtering device according to the invention involved in the formation of film is important in view of the expectation that film formation technique will add to its importance in the future, and will greatly contribute to the progress of industry.

The second aspect of the invention relates to a dual magnetron sputtering device, and a dual magnetron sputtering device in which relevant elements are arranged in accordance with the invention will allow high speed film formation to occur at a low temperature. Such a dual magnetron sputtering device, because of its being highly advantageous, will be widely accepted, and greatly contribute to the progress of industry.

Particularly, as described above in relation to Examples, according to the invention it is possible to form a film with titanium dioxide polycrystals exhibiting an excellent orientation and high photocatalytic activity on an unheated substrate, a feat that has never been achieved by any conventional methods. The technique itself is so valuable as to be notable, and will be vigorously utilized in the future.

What is noteworthy further still is the speed of film formation. Namely, according to the method of the invention, a titanium dioxide film formed at a rate of 40 nm/min, which is sufficiently high to allow mass production, still exhibits an effective photocatalytic activity, which is profoundly important. The crystals of a titanium dioxide film formed according to the invention have an anatase type crystal structure that is known to have the highest photocatalytic activity of all the crystal structures permitted to titanium dioxide materials, and furthermore the crystals are uniformly oriented to allow the c-axis of crystal lattice to be disposed normal to the surface of substrate. This observation well explains the reason why the film exhibits an excellent photocatalytic activity, in spite of its being formed under non-heating condition.

The invention provides a technique which enables the practical production of a compound product obtained by covering the surface of a heat-labile sheet made, for example, of plastic such as polyethylene terephthalate (PET) with a film having a photocatalytic activity, thereby conferring, as desired, the film the properties characteristic with a photocatalyst material such as defrosting, soil resistance, ultra-high hydrophilic activity, etc. The technique will be widely accepted and products produced based on the technique will form a big share in the market.

The invention claimed is:

1. A method of switching magnetic flux distribution, comprising:
    arranging a magnet on a rear side of a backing plate with respect to a target holding side thereof in a magnetron sputtering cathode,
    placing an article that exhibits ferromagnetism at room temperature on the target holding side of the backing plate, and
    removing the article therefrom, thereby switching the magnetic flux distribution between a balanced distribution of the magnetic flux and an unbalanced distribution of the magnetic flux,
    wherein, after the article that exhibits ferromagnetism at the room temperature is removed, an article that does not exhibit ferromagnetism at the room temperature is placed.

2. The method of switching magnetic flux distribution according to claim 1, wherein the article placed on the target holding side of the backing plate of the magnetron sputtering cathode is one selected from the group consisting of a middle pole, a middle pole cover, and an insulating body.

3. The method of switching magnetic flux distribution according to claim 1, wherein the magnetron sputtering cathode is a square-shaped sputtering cathode.

* * * * *